(12) United States Patent
Nagamatsu et al.

(10) Patent No.: US 8,379,452 B2
(45) Date of Patent: Feb. 19, 2013

(54) NONVOLATILE SEMICONDUCTOR MEMORY DEVICE

(75) Inventors: Kenichi Nagamatsu, Kanagawa (JP); Yasuhiro Tonda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 209 days.

(21) Appl. No.: 12/821,632

(22) Filed: Jun. 23, 2010

(65) Prior Publication Data

US 2011/0002173 A1 Jan. 6, 2011

(30) Foreign Application Priority Data

Jul. 3, 2009 (JP) ................................. 2009-158678

(51) Int. Cl.
*G11C 11/34* (2006.01)
(52) U.S. Cl. .......... 365/185.18; 365/185.23; 365/185.33
(58) Field of Classification Search ............. 365/185.03, 365/185.17, 185.18, 185.21, 185.23, 185.25, 365/185.26, 185.33
See application file for complete search history.

(56) References Cited

U.S. PATENT DOCUMENTS

| | | | | |
|---|---|---|---|---|
| 5,999,456 A * | 12/1999 | Sali et al. | ................. | 365/185.25 |
| 6,297,993 B1 * | 10/2001 | Chen et al. | ............... | 365/185.33 |
| 6,381,192 B1 * | 4/2002 | Ahn et al. | ................. | 365/185.23 |
| 6,426,894 B1 * | 7/2002 | Hirano | ...................... | 365/185.18 |
| 6,463,516 B1 * | 10/2002 | Leong et al. | ............. | 365/185.33 |
| 6,483,750 B2 * | 11/2002 | Dallabora et al. | ....... | 365/185.23 |
| 6,671,208 B2 * | 12/2003 | Sumitani et al. | ......... | 365/185.23 |
| 6,680,865 B2 * | 1/2004 | Watanabe | ................ | 365/185.26 |
| 6,747,897 B2 * | 6/2004 | Karaki | ..................... | 365/185.18 |
| 6,791,878 B2 * | 9/2004 | Jeong | ........................ | 365/185.17 |
| 6,927,999 B2 * | 8/2005 | Sim et al. | .................. | 365/185.18 |
| 7,224,618 B2 * | 5/2007 | Matsuoka | ................ | 365/185.18 |
| 7,423,915 B2 * | 9/2008 | Leong et al. | ............. | 365/185.33 |
| 7,477,543 B2 * | 1/2009 | Choi | ......................... | 365/185.03 |
| 7,492,637 B2 * | 2/2009 | Kim et al. | ................. | 365/185.18 |
| 7,679,964 B2 * | 3/2010 | Lee | ............................ | 365/185.18 |
| 2007/0171727 A1 | 7/2007 | Choi | | |

FOREIGN PATENT DOCUMENTS

JP 2007-193936 A 8/2007

* cited by examiner

*Primary Examiner* — Trong Phan
(74) *Attorney, Agent, or Firm* — Foley & Lardner LLP

(57) ABSTRACT

A nonvolatile semiconductor memory device includes a memory cell array in which a plurality of nonvolatile memory cells are arrayed, and a program voltage generator that switches current supply amount based on the number of memory cells that are programmed at the same time, among the plurality of memory cells. The nonvolatile semiconductor memory device further includes a selection circuit that selects, among the plurality of memory cells, one or more memory cells that are programmed, to flow a current outputted by the program voltage generator.

17 Claims, 6 Drawing Sheets

NONVOLATILE SEMICONDUCTOR MEMORY DEVICE

REFERENCE TO RELATED APPLICATION

This application is based upon and claims the benefit of the priority of Japanese patent application No. 2009-158678, filed on Jul. 3, 2009, the disclosure of which is incorporated herein in its entirety by reference thereto.

TECHNICAL FIELD

The present invention relates to a nonvolatile semiconductor memory device. In particular, the invention relates to a flash memory device having a write-disturb prevention function that prevents an effect on a nonselected memory cell when writing.

BACKGROUND

Conventionally, with regard to nonvolatile semiconductor memory devices such as a flash memory and the like, it is known that when data writing is selectively performed to a selected memory cell, a write-disturb phenomenon occurs in which a memory cell that is not selected is affected. In particular, along with progress in miniaturization, the write-disturb phenomenon is becoming evident as a problem.

In Patent Document 1, there is a description of a conventional flash memory device having a write-disturb prevention function. FIG. 3 is a block diagram of the overall conventional flash memory device described in Patent Document 1 where the device includes row decoder and word line driver 20, source decoder and source line driver 30, control circuit 60, and current mirror circuit 70. Bias voltage VBIAS is input to input driver 40 and control circuit 60. Input driver 40 also receives input data DIN1 to DINn. According to Patent Document 1, at a time of writing (programming) data, among a plurality of word lines (WL1 to WL2$m$) of a flash memory array 10, approximately 1 V is given to a selected word line and Vss are given to nonselected word lines. In the same way, there is a description of giving, among a plurality of source lines (SL1 to SLm), Vpp (approximately 10 V) to a selected source line and Vss to nonselected source lines, and among a plurality of bit lines (BL1 to BLn), giving approximately 0.4 V to a selected bit line and Vcc to nonselected bit lines, and performing writing (programming). With regard to the selection of bit lines, selection of a plurality or bit lines at the same time is possible, and writing to a plurality of memory cells having a common word line at the same time is possible.

The flash memory array 10 is configured as in a block diagram shown in FIG. 4, and when writing (programming) is performed to a memory cell 11, a current Ip flows in a route of: source line SL1 to memory cell 11 and bit line BL1, and writing (programming) is performed with regard to the memory cell 11. When writing is performed with regard to the memory cell 11, a memory cell 12 having the source line SL1 and the bit line BL1 in common may also receive an effect of the writing. This is a write-disturb effect. In particular, since current flowing from a source line differs according to the number of memory cells performing writing at the same time, the voltage Vpp of the source line also receives an effect. In particular, in a case where the number of memory cells performing writing at the same time is small, since the voltage Vpp of the source line is a high voltage, the write-disturb effect easily occurs.

In Patent Document 1, in order to prevent this write-disturb occurrence, a program current compensation circuit 100 (FIG. 3) is provided, and in a case where the number of memory cells performing writing at the same time is small and the current flowing in the flash memory cell array 10 is small, by a current flowing in the program current compensation circuit 100 instead of the flash memory cell array 10, according to the number of memory cells performing writing at the same time, load on a program voltage generation circuit 50, which generates the voltage Vpp of the source line, is always equal.

FIG. 5 is a block diagram of the program current compensation circuit 100 described in Patent Document 1. The circuit 100 includes transistors MN5, MN6, MP3, MP2, MN31, MN32, MN41, MN3$n$ and MN4$n$, as well as nodes N3, N5, N41, N42 and N4$n$, arranged as shown in FIG. 5. According to write data DIN1 to DINn, current flowing at a current source of a current mirror circuit is gradually changed, and by this current flowing from a power supply Vpp of a source line by current mirror circuits 68 and 70, the current flowing in the source line is always constant, independent of the number of memory cells performing writing at the same time, and the occurrence of a write-disturb effect is prevented.

[Patent Document 1]
JP Patent Kokai Publication No. JP2007-193936A, which corresponds to US Patent Publication No. US2007/0171727A1.

SUMMARY

The entire disclosure of above-identified Patent Documents are incorporated herein by reference thereto.

The following analysis is given by the present invention. According to Patent Document 1, when the number of memory cells performing writing at the same time is small, by a current flowing in a program current compensation circuit 100 instead of a memory cell array, a voltage Vpp of a source line is always a constant voltage, independent of the number of memory cells performing writing at the same time. However, the current flowing in the program current compensation circuit 100 is wasted current that is basically unnecessary for writing to a memory cell. According to usage application, it is necessary to reduce average current as much as possible when performing writing.

According to a first aspect of the present invention there is provided a nonvolatile semiconductor memory device includes: a memory cell array in which a plurality of nonvolatile memory cells are arrayed, a program voltage generator that switches current supply amount based on the number of memory cells that are programmed at the same time, among the plurality of memory cells, and a selection circuit that selects, among the plurality of memory cells, one or more memory cells that are programmed, to flow a current outputted by the program voltage generator.

According to a second aspect of the present invention there is provided a flash memory device includes: a plurality of bit lines; a plurality of word lines wired in a direction intersecting the plurality of bit lines; a source line; and a flash memory cell array. The flash memory cell array includes a plurality of flash memory cells arranged to correspond with respective intersection points of the plurality of bit lines and the plurality of word lines, and respectively connected to the source line and to corresponding bit lines and word lines. The flash memory device further includes: a plurality of switch transistors respectively connected between the plurality of bit lines and a reference potential, and whose ON-OFF states are controlled respectively by a plurality of write data signals respectively corresponding to the plurality of bit lines; and a program voltage generator to which the plurality of write data signals are connected and which supplies the source line with an amount of current in accordance with number of the plurality of switch transistors turned ON by the plurality of write data signals.

The meritorious effects of the present invention are summarized as follows.

According to the present invention, a program voltage generator switches current supply amount based on the number of memory cells that program at the same time, so that it is possible to prevent an occurrence of a write-disturb effect, and also it is possible to restrain program current.

PREFERRED MODES

Figure 1:
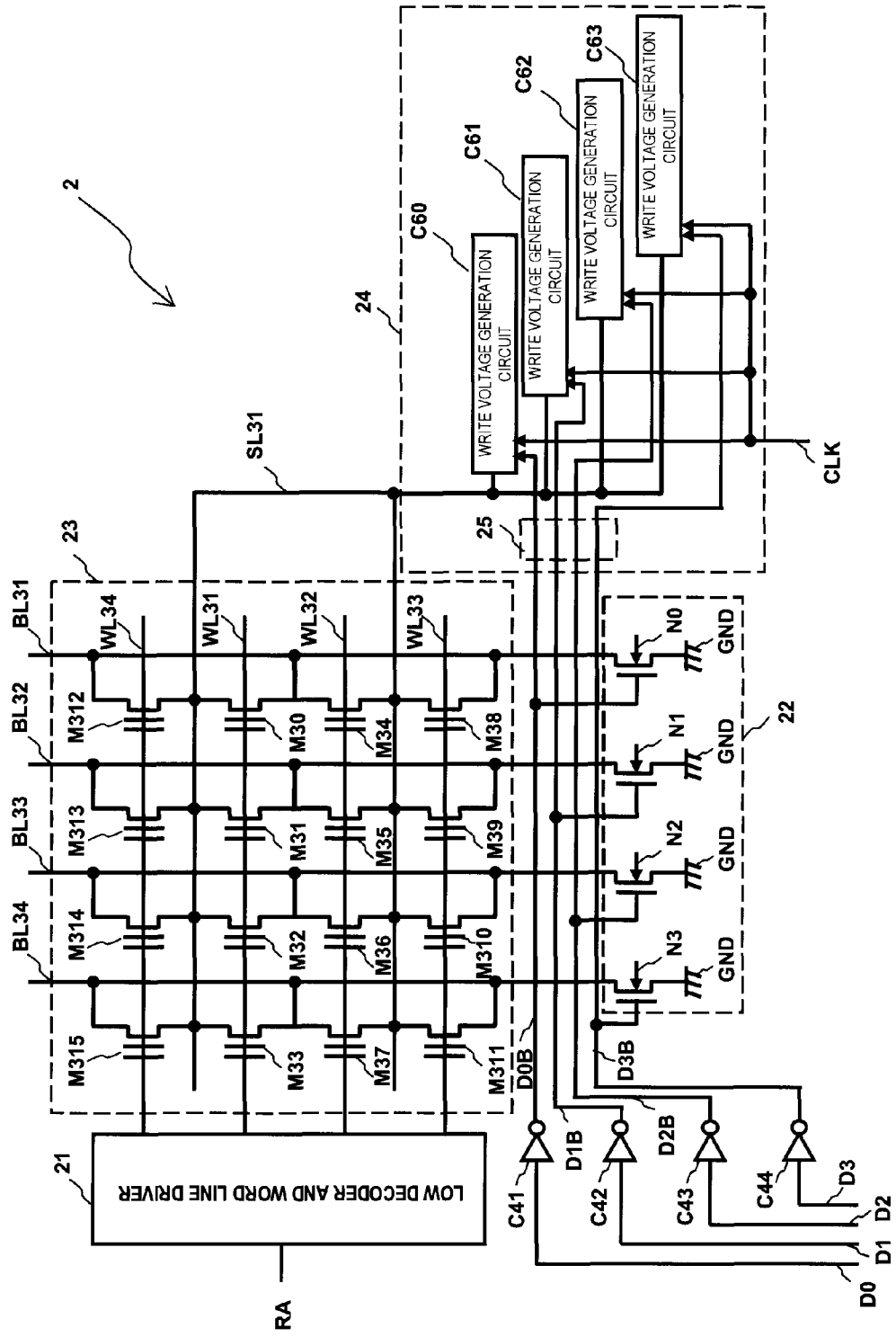
FIG. 1 is a block diagram of a nonvolatile semiconductor memory device according to an example of the preferred modes.

Before describing examples of preferred modes in detail, a description is first given of an outline of preferred modes of the present invention. Drawings cited in the outline description and reference symbols in the drawings are shown as one example of the preferred modes, and are not intended to limit variations of the preferred modes according to the present invention.

An exemplary embodiment of the present invention, as shown in FIG. 1 for example, includes a memory cell array 23 in which a plurality of nonvolatile memory cells (M30 to M39, and M310 to M315) are arrayed; a program voltage generator 24 that switches current supply amount based on the number of memory cells that are programmed at the same time, among the plurality of memory cells (M30 to M39, and M310 to M315); and selection circuits (21 and 22) that select one or more memory cells that are programmed, among the plurality of memory cells (M30 to M39, and M310 to M315), to flow a current outputted by the program voltage generator 24.

Furthermore, the program voltage generator 24 includes a plurality of program voltage generation circuits (C60 to C63), and a controller 25 that controls, among the plurality of program voltage generation circuits (C60 to C63), the number of program voltage generation circuits operated at the same time based on the number of memory cells that program at the same time. In a case where the number of memory cells that program at the same time is determined, according to the number of bit lines, since operation of each program voltage generation circuit (C60 to C63) may be controlled by a control signal (for example, D0B to D3B in FIG. 1) of each bit line or an inverted signal thereof, this is a simplest configuration for the controller 25. The control signals (D0B to D3B) of each of the bit lines may be the control signals as they are, or inverted signals thereof may be the control signals. In FIG. 1, the control signals (D0B to D3B) of each of the bit lines are the control signals of the program voltage generation circuits (C60 to C63), as they (the control signals D0B to D3B) are.

Furthermore, a nonvolatile semiconductor memory device 2 is a nonvolatile semiconductor memory device 2 that can program multi-bit data (D0 to D3) in parallel, and the controller 25 controls the number of the program voltage generation circuits (C60 to C63) operated at the same time, based on the number of bits of logic "1" or the number of bits of logic "0". The number of program voltage generation circuits does not necessarily match the number of bits that program in parallel, and it is sufficient to be able to control the number of program voltage generation circuits operated, according to the number of bits that program in parallel, by the controller 25. Furthermore, according to the number of bits of logic "1" or the number of bits of logic "0" in the program data (D0 to D3), since the amount of current flowing when programming, changes, the number of the program voltage generation circuits operated at the same time may be controlled based on this number of bits.

Figure 2:
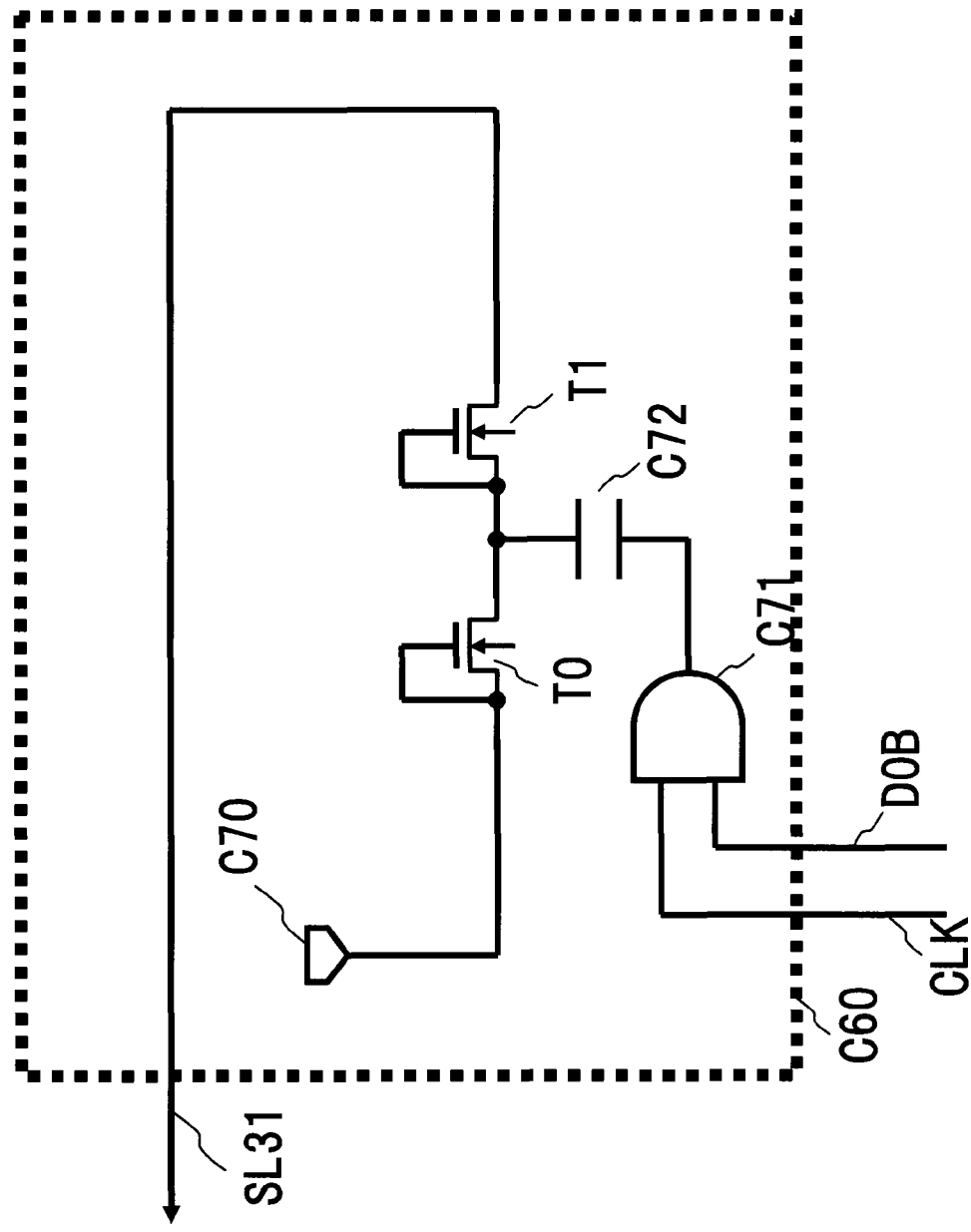
FIG. 2 is a block diagram showing a configuration of a write voltage generation circuit in the example.
Figure 3:
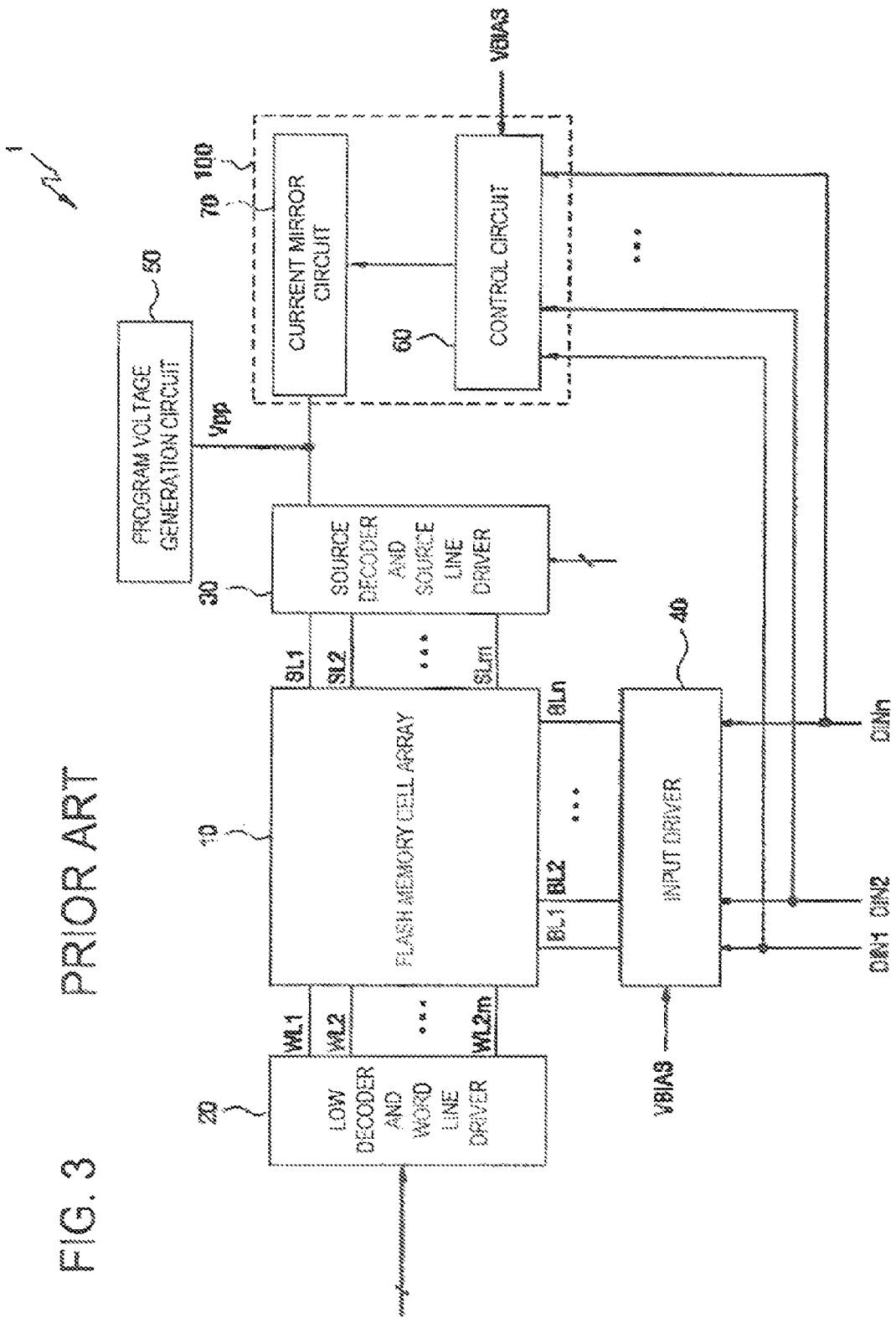
FIG. 3 is a block diagram of an overall conventional flash memory device described in Patent Document 1.
Figure 4:
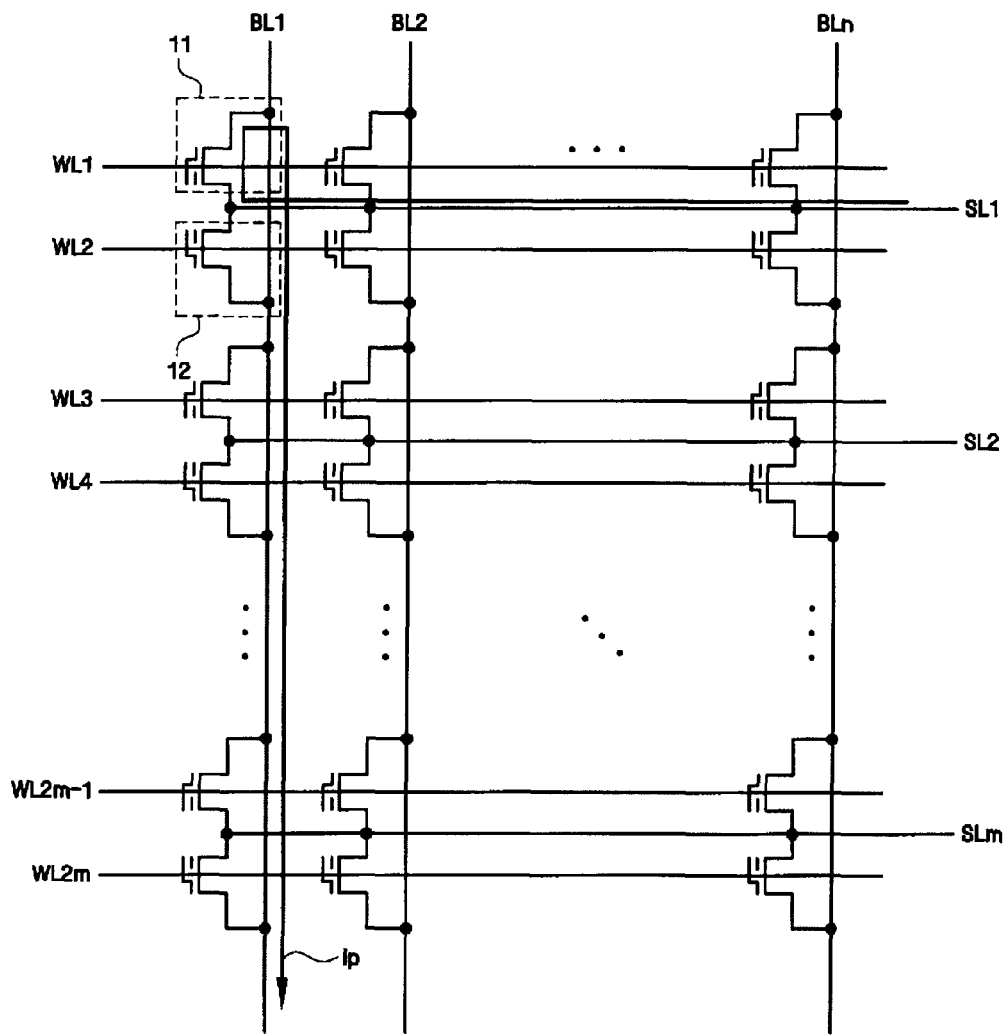
FIG. 4 is a block diagram of a memory cell array in the conventional flash memory device described in Patent Document 1.
Figure 5:
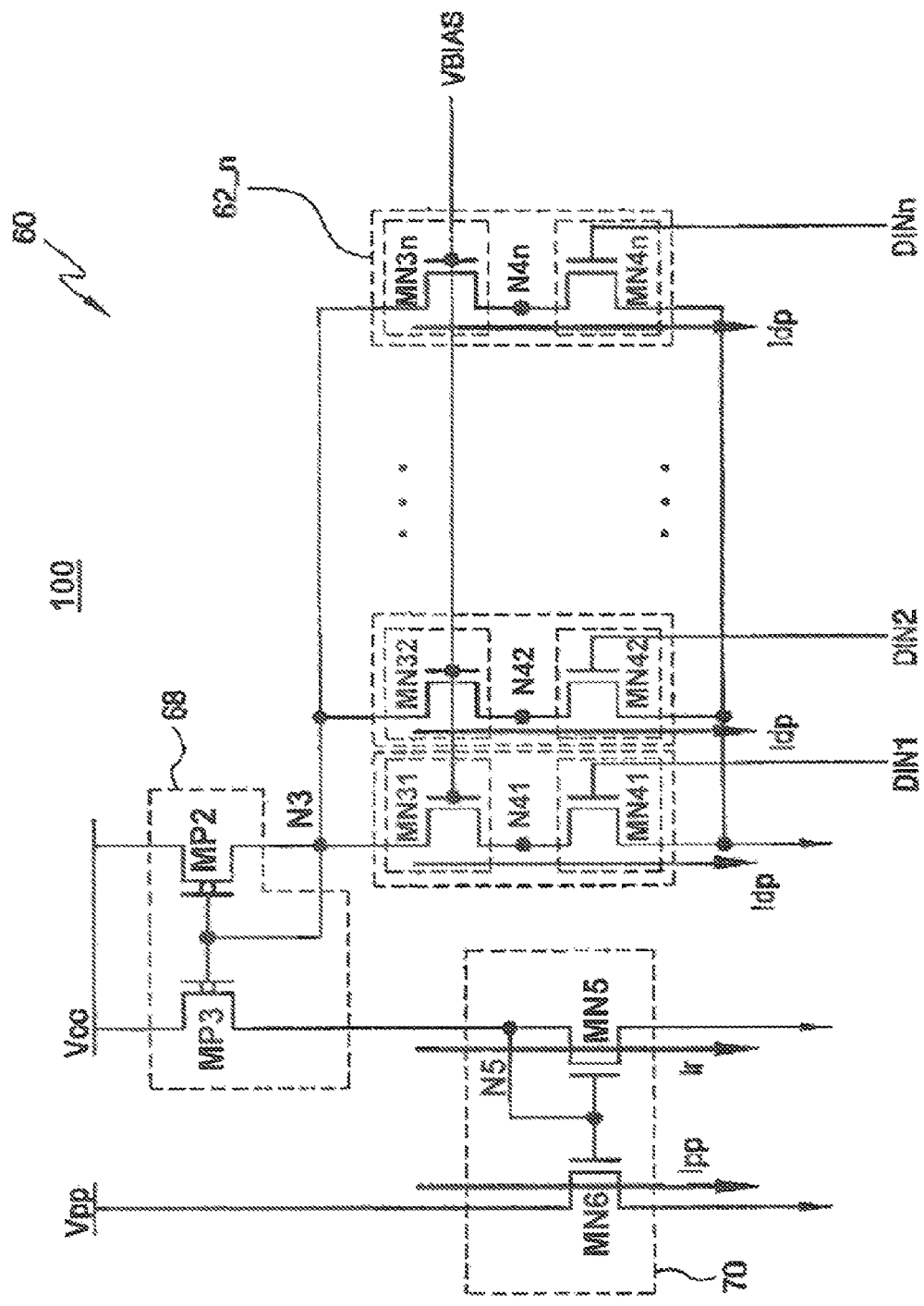
FIG. 5 is a block diagram of a program current compensation circuit in the conventional flash memory device described in Patent Document 1.

Furthermore, as shown in FIG. 2 for example, the program voltage generation circuit C60 includes a charge pump circuit. As shown in FIG. 1 for example, the memory cell array 23 includes a plurality of bit lines (BL31 to BL34) and a plurality of word lines (WL31 to WL34) wired in a direction intersecting the plurality of bit lines (BL31 to BL34), and the selection circuits (21 and 22) select a bit line and a word line connected to a memory cell that programs, among the plurality of bit lines (BL31 to BL34) and the plurality of word lines (WL31 to WL34). The nonvolatile semiconductor memory device 2 may be a flash memory.

Furthermore, the flash memory device 2 of one exemplary embodiment of the present invention, as shown in FIG. 1 for example, includes a plurality of bit lines (BL31 to BL34); a plurality of word lines (WL31 to WL34) wired in a direction intersecting the plurality of bit lines (BL31 to BL34); a source line SL31; and a flash memory cell array 23. The flash memory cell array 23 includes a plurality of flash memory cells (M30 to M39, and M310 to M315) arranged to correspond with respective intersection points of the plurality of bit lines (BL31 to BL34) and the plurality of word lines (WL31 to WL34) and respectively connected to the source line SL31 and to corresponding bit lines and word lines. The flash memory device 2 further includes: a plurality of switch transistors (N0 to N3), respectively connected between the plurality of bit lines (BL31 to BL34) and a reference potential GND, and whose ON-OFF states are controlled respectively by a plurality of write data signals (D0B to D3B) respectively corresponding to the plurality of bit lines (BL31 to BL34); and a program voltage generator 24, to which the plurality of write data signals (D0B to D3B) are connected, and which supplies the source line SL31 with an amount of current in accordance with the plurality of switch transistors (N0 to N3) turned ON by the plurality of write data signals (D0B to D3B). Since the program voltage generator 24 supplies the source line SL31 with an amount of current in accordance with a value of the plurality of the write data signals (D0B to D3B) that control the ON-OFF states of the switch transistors (N0 to N3), the program voltage generator 24 can supply sufficient current that is necessary for programming (writing). Therefore, it is possible to prevent a write-disturb occurrence, and to realize a reduction in current consumed in writing.

Furthermore, the program voltage generator 24 includes the program voltage generation circuits (C60 to C63) respectively connected to the source line SL31, and the controller 25 that controls the number of program voltage generation circuits that are operated, among the plurality of program voltage generation circuits (C60 to C63), by the plurality of write data signals (D0B to D3B). Furthermore, as shown in FIG. 2 for example, the program voltage generator 24 includes a charge pump circuit. The charge pump circuit includes a booster capacitor C72 and rectifier elements (T0 and T1). An operation of the charge pump circuit is controlled by the plurality of write data signals (D0B to D3B); and an output signal of the charge pump circuit is connected to the source line SL31. The rectifier elements may use an element, with the element itself having a rectifying function, such as a diode-connected transistor, a diode, or the like; a switching transistor may be used in the rectifier elements (T0 and T1); and the switching transistor may be turned ON and OFF in synchronization with a clock CLK, to perform boosting. In addition, the plurality of program voltage generation circuits (C60 to C63) may each include a charge pump circuits. The charge pump circuit may includes the booster capacitor C72 and the rectifier elements (T0 and T1). An operation of the charge pump circuit is controlled by the controller 25. A more detailed description concerning examples is given below, making reference to the drawings.

FIRST EXAMPLE

<Overall Configuration of the First Example>

FIG. 1 is a block diagram of a nonvolatile semiconductor memory device 2 according to the first example. In the overall configuration of the nonvolatile semiconductor memory device 2, FIG. 1 shows a configuration of a portion mainly related to writing (programming), and a part of a configuration of portions related to reading or erasing is omitted. The nonvolatile semiconductor memory device 2 is configured to include a memory cell array 23, selection circuits (21 and 22), and a program voltage generator 24. The nonvolatile semiconductor memory device 2 of the first example is preferably a flash memory device that can be erased in block units and in which writing is possible in memory cell units.

The memory cell array 23 is disposed such that plural nonvolatile memory cells (M30 to M39, and M310 to M315) correspond to respective intersection points of a plurality of bit lines (BL31 to BL34) wired in parallel, and a plurality of word lines (WL31 to WL34) wired in a direction intersecting the plurality of bit lines. The respective nonvolatile memory cells (M30 to M39, and M310 to M315) are connected to the respective corresponding bit lines (BL31 to BL34) and the corresponding word lines (WL31 to WL34), and in addition are connected also to the source line SL31. The respective nonvolatile memory cells (M30 to M39, and M310 to M315) are provided with a memory transistor; one of a source or a drain of the memory transistor is connected to a corresponding bit line and the other of the source and the drain is connected to the source line, and a control gate is connected to a corresponding word line. In the memory cell transistors, a charge storage layer, which is a floating gate or a trap layer, is provided between a control gate and a channel region.

In writing data to a memory cell, similar to Patent Document 1 for example, writing may be performed by giving a positive voltage (approximately 1V) equivalent to a threshold voltage of a transistor to a selected word line, grounding a bit line to a reference potential GND, giving a high voltage (approximately 5V) to a source line, and flowing a current from the source line to the bit line. Or, a nonselected word line may be the reference potential GND, and the bit line may be a power supply voltage VCC.

With regard to selection circuits (21 and 22), a selection circuit 1 (low decoder and word line driver) 21 that controls the plurality of word lines (WL31 to WL34), and a selection circuit 2 (input driver) 22 that controls the plurality of bit lines (BL31 to BL34) are provided. The selection circuit 1 (low decoder and word line driver) 21, in a write (program) operation, selects and activates word lines connected to the memory cells (M30 to M39, and M310 to M315) that are to be written to, among the plurality of word lines (WL31 to WL34).

Furthermore, the selection circuit 2 (input driver) 22, when making a write (program) operation, selects the bit lines (BL31 to BL34) to which the memory cells (M30 to M39, and M310 to M315) performing the writing are connected, based on a value of write (program) data signals (D0 to D3). In addition, inside the selection circuit 2 (input driver) 22, switch transistors (N0 to N3), whose ON-OFF states are controlled by the write data signals (D0 to D3), are respectively arranged corresponding to the plurality of bit lines (BL31 to BL34), and a decision is made as to whether or not writing is performed to the nonvolatile memory cells (M30 to M39, and M310 to M315) connected to corresponding bit lines (BL31 to BL34), according to a value of each bit of the write data signals (D0 to D3). Specifically, the write data signals (inverted signals) (D0B to D3B), which are inverted signals of the write data signals (D0 to D3), are respectively connected to gates of the corresponding switch transistors (N0 to N3), a source of the switch transistors (N0 to N3) is connected to the reference potential GND, and a drain is connected to respective bit lines (BL31 to BL34). According to the configuration of the abovementioned selection circuit 2 (input driver) 22, when each of 4-bit write data signals (D0 to D3) is "1", writing is not performed, and when each of the 4-bit write data signals (D0 to D3) is "0", writing is performed simultaneously to 4-bit memory cells. That is, among the 4-bit write data signals (D0 to D3), writing is performed simultaneously to the same number of memory cells as the number of bits whose data is "0".

The program (write) voltage generator 24 is provided with a plurality of write voltage generation circuits (C60 to C63). The plurality of write voltage generation circuits (C60 to C63) each receive a control signal outputted by the controller 25 and a boosting clock signal CLK, and output is connected to the source line SL31.

Furthermore, the program (write) voltage generator 24 is provided with the controller 25; the controller 25 receives the write data signals (inverted signals) (D0B to D3B), and outputs a control signal of each of the write voltage generation circuits (C60 to C63). The controller 25 judges the number of memory cells to perform writing simultaneously, by a value of the write data signals (inverted signals) (D0B to D3B), decides the number of the write voltage generation circuits (C60 to C63) to be operated at the same time, and controls operation of the write voltage generation circuits (C60 to C63). In FIG. 1, values of the write data signals (inverted signals) (D0B to D3B) are used as they are, for control of the respective write voltage generation circuits (C60 to C63). Therefore, in FIG. 1, the controller 25 is simply wiring, but in general, with the write data signals (inverted signals) (D0 to D3) or/and inverted signals (D0B to D3B) thereof as input, a configuration can be arranged by a decoder circuit or the like, which controls the respective write voltage generation circuits (C60 to C63).

[Configuration of the Write Voltage Generation Circuit of the First Example]

FIG. 2 is a block diagram showing a configuration of a write voltage generation circuit C60. The write voltage generation circuit C60 is configured to include an AND circuit C71, a booster capacitor C72, and first and second rectifier elements (T0 and T1). The boosting clock signal CLK and a control signal outputted by the controller 25 (specifically, an inverted signal DOB being a 0-th bit of a write data signal is connected as it is) are connected as received signals at a gate of the AND circuit C71, and an output signal is connected to a first end of the booster capacitor C72. Furthermore, the first rectifier element T0 is connected between a write voltage generation circuit power supply C70 and a second end of the booster capacitor C72, and rectification is performed so that current flows in one direction from the write voltage generation circuit power supply C70 to the second end of the booster capacitor C72. Furthermore, the second rectifier element T1 is connected between the second end of the booster capacitor C72 and the source line SL31, and rectification is performed so that current flows in one direction from the second end of the booster capacitor C72 to the source line SL31.

These rectifier elements (T0 and T1) and the booster capacitor C72 function as a charge pump circuit, and when the control signal (specifically, an inverted signal DOB being a 0-th bit of a write data signal) is at a high level, the power supply of the write voltage generation circuit power supply C70 is boosted by the boosting clock CLK and supplied to the source line SL31. By having this type of configuration, when the write data inverted signal DOB is at a low level, that is, when write data D0 has data of "1", since a boosting operation does not take place, control that does not generate a prescribed write voltage is possible, and suppression of power consumption is possible. FIG. 2 shows a configuration of the write voltage generation circuit C60; by the input signal DOB, which is a control signal, being replaced by D1B to D3B only, the configuration of the other write voltage generation circuits (C61 to C63) becomes identical to the configuration of the write voltage generation circuit C60.

In FIG. 1, four write voltage generation circuits (C60 to C63) are provided, and current supply capability to the source line of one of the write voltage generation circuits may be ¼, compared to a case where one write voltage generation circuit is provided as in Patent Document 1. This is because it is possible to operate at most four write voltage generation circuits in parallel, matching the number of cells performing writing at the same time. Therefore, since layout area for each one write voltage generation circuit can be made small even if the number of write voltage generation circuits increases, the overall area of the program voltage generator 24 does not become large.

In FIG. 2, use is made of an N-channel MOS transistor T0 in which, as the rectifier element T0, a gate and drain are diode-connected to the write voltage generation circuit power supply C70 and a source is diode-connected to the other end of the booster capacitor C72; and use is made of an N-channel MOS transistor T1 in which, as the rectifier element T1, a gate and drain are diode-connected to the other end of the booster capacitor C72, and a source is diode-connected to the source line SL31. In these rectifier elements T0 and T1, a diode in which an anode is connected to the voltage generation circuit power supply C70 and a cathode is connected to the other end of the booster capacitor C72, can be replaced by a diode in which an anode is connected to the other end of the booster capacitor C72 and a cathode is connected to the source line SL31.

Furthermore, with regard to these rectifier elements T0 and T1, as the rectifier element T0, it is possible to use an N-channel MOS transistor (instead of T0), in which one of a source and drain is connected to the write voltage generation circuit power supply C70, the other of the source and drain is connected to the other end of the booster capacitor C72, and a gate is connected to a signal obtained by boosting an inverted signal of the boosting clock signal CLK to a high voltage; and as the rectifier element T1, it is possible to use an N-channel MOS transistor T1, in which one of a source and drain is connected to the other end of the booster capacitor C72, the other of the source and drain is connected to the source line SL31, and a gate is connected to a signal obtained by boosting a noninverted signal of the boosting clock signal CLK to a high voltage.

In FIG. 1 a description is given in which the write data signals (D0 to D3) are 4-bit input data, but it is possible to handle an increase in the number of input bits by changing a configuration of the controller 25. Furthermore, in the present example the same number of write voltage generation circuits (C60 to C63) is provided as the number of bits of the write data signals (D0 to D3), but by configuring the controller 25 so that, among a plurality of provided write voltage generation circuits, in comparison with the number of bits with logic of "0" or "1" of the write data signal (D0 to D3) or the write data inverted signal (DOB to D3B), an arbitrary number of write voltage generation circuits are operated, it is possible to optimally control the current supply capability of the write voltage generator 24.

[Operation of the First Example]

A description is given in further detail concerning operation of the first example. In the first example, by having the write data inverted signals (DOB to D3B) as enable signals of the write voltage generation circuits (C60 to C63) and the switch transistors (N0 to N3) for write current control, among the plural write voltage generation circuits (C60 to C63) and the plural switch transistors (N0 to N3) for write current control, by the write data (D0 to D3), through controlling the number of operated switch transistors and write voltage generation circuits, it is arranged that unnecessary write current does not flow. In this way, it is possible to reduce a write-disturb effect and to reduce consumed current. It is possible to reduce the consumed current because a dummy write current as in Patent Document 1 need not be flowed.

In a case of data of the write data D0 having a value of "0", the write data inverted signal DOB has a high level, and the switch transistor N0 is ON. The write data inverted signal DOB is received at the same time as an enable signal of the write voltage generation circuit C60, and the write voltage generation circuit C60 is active. In a case of data of the write data D0 having a value of "1", the write data inverted signal DOB has a low level, and the transistor N0 is OFF. The write data inverted signal DOB is received at the same time as an enable signal of the write voltage generation circuit C60, and the write voltage generation circuit C60 is nonactive. Control of the switch transistors (N1 to N3) in accordance with the values of the write data signals (D1 to D3) is similar to control of the switch transistor N0 in accordance with the value of the write data signal D0. Furthermore, control of the write voltage generation circuits (C61 to C63) in accordance with the values of the write data signals (D1 to D3) is similar to control of the write voltage generation circuit C60 in accordance with the value of the write data signal D0.

The memory cells (M30 to M33) are memory cells selected according to the word line WL31, among the memory cells of the memory cell array 23. The memory cells (M30 to M33) flow a write current according to values of the write data signals (D0 to D3). As an example, in FIG. 1, the write current of the flash memory cells (M30 to M33) is set to 100 µA. The respective write voltage generation circuits (C60 to C63) are divided into a plurality of write voltage generation circuits, not having a write voltage generation circuit 50 as a single circuit, as in Patent Document 1. The total current supply capability of the plural write voltage generation circuits (C60 to C63) is approximately the same as the current supply capability in a case of providing a single write voltage generation circuit as in the conventional write voltage generation circuit 50. As an example, the current supply capabilities of the plural write voltage generation circuits (C60 to C63) in FIG. 1 are each set as 5.0 V @ 100 μA (Total 400 μA). Furthermore, memory cell source line voltage is set as 5.0 V.

For a state in which the word line WL31 has a high level and the flash memory cells (M30 to M33) are selected, a description is given below concerning operation according to difference of values of the write data D0 to D3 and current when an operation is performed.

(1-1) In a case where a value of the write data signals (D0 to D3) is "0000", the switch transistors (N0 to N3) are all ON, current flows to the flash memory cells (M30 to M33), and writing is performed. Since the current necessary for writing is a current that flows in four memory cells that are the flash memory cells (M30 to M33), the total current is 400 μA. By all of the write data signals (D0 to D3) being 0, all of the write voltage generation circuits (C60 to C63) operate. With regard to the capability of an output load current flowing from the source line SL31 through the memory cells (M30 to M33) to the reference potential GND, when the voltage of the source line SL31 is 5.0 V, 400 μA can flow. In order that current flows to all of the flash memory cell array (M30 to M33), the voltage of the source line SL31 is 5.0 V.

(1-2) In a case where a value of the write data signals (D0 to D3) is "1111", all of the switch transistors (N0 to N3) are OFF, a current does not flow to the memory cells (M30 to M33), and writing does not occur. Since writing does not occur, current necessary for writing is 0 μA. Furthermore, all of the write voltage generation circuits (C60 to C63) are stopped, and current does not flow to the memory cell array (M30 to M33). Output of the write voltage generation circuits (C60 to C63) is 0 V.

(1-3) In a case where a value of the write data signals (D0 to D3) is "0101", with regard to the switch transistors (N0 to N3), the switch transistors (N0 and N2) are ON, the transistors N1 and N3 are OFF, current flows to the memory cells (M30 and M32), and writing is performed. On the other hand, with regard to the memory cells (M31 and M33), since a current does not flow, writing is not performed. Since the current necessary for writing is a current that flows in the memory cells (M30 to M32), the total current is 200 μA. The capability of the output load current is 200 μA for an output level of 5.0 V in order that the write voltage generation circuits (C60 and C62) operate. Furthermore, output of the write voltage generation circuits (C60 and C62) is 5.0 V since current flows to the memory cells (M30 and M32). From the abovementioned (1) to (3), in the first example, it is possible to keep source line voltage constant and reduce the write-disturb effect, and also, excepting the case of (1), it is possible to reduce consumed current more than as with conventional technology.

[Comparison of Write Operation Current with a Comparative Example]

Figure 6:
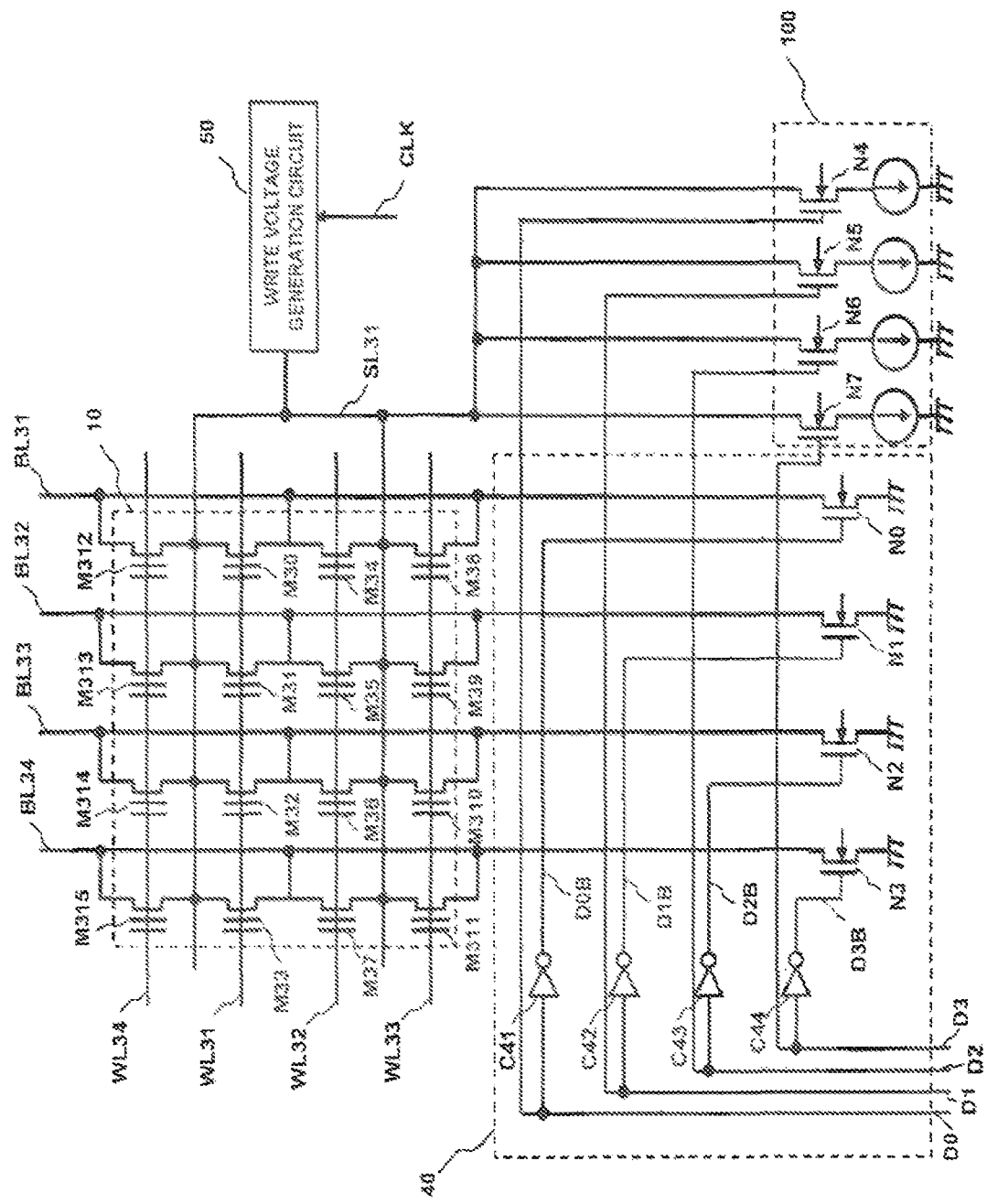
FIG. 6 is a block diagram of a flash memory device according to a comparative example.

FIG. 6 is a block diagram of a flash memory device of a comparative example. The comparative example includes an input driver 40. In the comparative example, there is one write voltage generation circuit 50, and an output current of the write voltage generation circuit 50 is always constant. Furthermore, in order to avoid a write disturb effect, as in Patent Document 1, there is provided a program current compensation circuit 100, which has switch transistors N4-N7 that gives a load to a program voltage generation circuit according to data applied to the memory cell array. With regard to the nonvolatile semiconductor memory device of the first example, a description is given comparing consumed current when a writing operation is performed with the comparative example of FIG. 6. In either case WL31 is selected as a word line.

(2-1) In a case where a value of the write data signals (D0 to D3) is "0000", since writing is performed to the four memory cells (M30 to M33) selected according to word line, in the comparative example (FIG. 6), a compensation current does not flow in the program current compensation circuit 100, and in the first example (FIG. 1), since all of the four write voltage generation circuits (C60 to C63) operate, there is no large difference between the consumed current of the comparative example and the first example of preferred modes.

(2-2) In a case where a value of the write data signals (D0 to D3) is "1111", all of the switch transistors (N0 to N3) are OFF, a current does not flow to the flash memory cells (M30 to M33), and writing does not occur. In a case of the comparative example, since a dummy write current approximately the same as for the flash memory cell array M30 to M33 flows in the program current compensation circuit 100, the total load current of the write voltage generation circuit 50 is 400 μA. From the total load current of the write voltage generation circuit 50 being 400 μA, the consumed current I1 is as in the following expression (Expression 1).

$$I1 = 400 \times 1/\alpha + \beta (\mu A) \quad \text{(Expression 1)}$$

($\alpha$ is voltage boosting efficiency, $\beta$ is consumed current outside of the write voltage generation circuit, $\alpha<1$)

The current necessary for writing is 0 μA in a case of the first example, and since the write voltage generation circuits C60 to C63 are stopped, the consumed current I2 is as in the following expression (Expression 2).

$$I2 = \beta (= 0 \times 1/\alpha + \beta)(\mu A) \quad \text{(Expression 2)}$$

Accordingly, in the first example, comparing with the comparative example, a consumed current reduction of $400 \times 1/\alpha$ (μA) is possible.

(2-3) In a case where a value of the write data signals (D0 to D3) is "0101", with regard to the switch transistors (N0 to N3), the transistors (N0 and N2) are ON, the transistors (N1 and N3) are OFF, current flows to the memory cells (M30 and M32), and writing is performed. On the other hand, with regard to the memory cells (M31 and M33), since a current does not flow, writing is not performed. Since the current necessary for writing is a current that flows in the memory cells (M30 to M32), the total current is 200 μA. In a case of the comparative example, since a dummy write current approximately the same as for the flash memory cell array M30 to M33 flows, the total load current of the write voltage generation circuit 50 is 400 μA. From the total load current of the write voltage generation circuit 50 being 400 μA, the consumed current I1 is as in the following expression (Expression 3).

$$I1 = 400 \times 1/\alpha + \beta (\mu A) \quad \text{(Expression 3)}$$

On the other hand, in the first example, the current necessary for writing is 200 μA, and the consumed current I2 is as in the following expression (Expression 4)

$$I2 = 200 \times 1/\alpha + \beta (\mu A) \quad \text{(Expression 4)}$$

Accordingly, in the first example, comparing with the comparative example, a consumed current reduction of $200 \times 1/\alpha$ (μA) is possible.

From the abovementioned (2-1) to (2-3), in the first example, source line voltage is kept constant, the write-disturb effect is reduced, and also, excepting the case of (2-1), it is possible to reduce the consumed current when a write operation is performed, more than in the comparative example.

Furthermore, with regard to the write voltage generation circuits (C60 to C63) of the first example, since the current supply capability is approximately ¼ compared to the write voltage generation circuit 50 of the comparative example, element size of the rectifier elements (T0 and T1) and the booster capacitor C72 can be made small. Therefore, even if the number of the write voltage generation circuits is increased four-fold, area is not enlarged. In the first example, since there is no necessity to provide the program current compensation circuit 100 as in the comparative example, to that extent, circuit area can be reduced.

In the abovementioned examples, a description has been given mainly concerning writing to flash memory, but for example, the present invention can also be applied to a nonvolatile semiconductor memory device in which a data erasing program is executed in memory cell units. In this case, it is also possible to have a program voltage generator that switches the current supply amount based on the number of memory cells erased at the same time in the erasing program in memory cell units.

Furthermore, with regard to structure of the memory cells in FIG. 1, the structure of the memory cells is shown where there is one control gate in each memory cell, but a nonvolatile memory cell having a memory gate as well as the control gate, or what is referred to as a split gate type, is also possible. In this case, a configuration is possible that is divided into the control gate, a selection circuit that controls the control gate in a selection circuit 1 (low decoder and word line driver) 21 in a case where different signals are given to memory gates, and a selection circuit that controls the memory gate.

A description has been given above according to the examples but the present invention is not limited to only configurations of the abovementioned examples, and clearly includes every type of transformation and modification that a person skilled in the art can realize within the scope of the present invention.

What is claimed is:

1. A nonvolatile semiconductor memory device comprising:
   a plurality of bit lines;
   a plurality of word lines wired in a direction intersecting said plurality of bit lines;
   a source line corresponding to the plurality of word lines;
   a memory cell array including a plurality of nonvolatile memory cells arranged to correspond with respective intersection points of said plurality of bit lines and said plurality of word lines, and respectively connected to said source line and to corresponding bit lines and word lines;
   a program voltage generator that switches current supply capability to said source line based on the number of memory cells that are programmed at the same time, among said plurality of memory cells; and
   a selection circuit that selects, among said plurality of memory cells, one or more memory cells that are programmed, to flow a current outputted by said program voltage generator.

2. The nonvolatile semiconductor memory device according to claim 1, wherein said program voltage generator comprises:
   a plurality of program voltage generation circuits; and
   a controller that controls, among said plurality of program voltage generation circuits, the number of program voltage generation circuits operated at the same time based on the number of memory cells that are programmed at the same time,
   wherein said controller switches the current supply capability by controlling, among said plurality of program voltage generation circuits, the number of said program voltage generation circuits to be operated at the same time based on judging the number of said memory cells programmed at the same time by write data signals for said memory cells.

3. The nonvolatile semiconductor memory device according to claim 1, said device being able to program multi-bit data in parallel, wherein
   said program voltage generator comprises a controller that controls current supply capability for program voltage of said program voltage generator, based on the number of bits of logic "1" or the number of bits of logic "0", among said multi-bit data.

4. The nonvolatile semiconductor memory device according to claim 1, wherein
   said selection circuit selects a bit line and a word line connected to said memory cell that is programmed, among said plurality of bit lines and said plurality of word lines.

5. The nonvolatile semiconductor memory device according to claim 1, wherein said nonvolatile semiconductor memory device is a flash memory.

6. The nonvolatile semiconductor memory device according to claim 1, in a case where logic "1" is programmed to at least all of said memory cells programmed at the same time, said program voltage generator is stopped.

7. A flash memory device comprising:
   a plurality of bit lines;
   a plurality of word lines wired in a direction intersecting said plurality of bit lines;
   a source line corresponding to the plurality of word lines;
   a flash memory cell array including a plurality of flash memory cells arranged to correspond with respective intersection points of said plurality of bit lines and said plurality of word lines, and respectively connected to said source line and to corresponding bit lines and word lines;
   a plurality of switch transistors respectively connected between said plurality of bit lines and a reference potential, and whose ON-OFF states are controlled respectively by a plurality of write data signals respectively corresponding to said plurality of bit lines; and
   a program voltage generator, to which said plurality of write data signals are connected and which supplies to said source line a capability of current in accordance with the number of said plurality of switch transistors turned ON by said plurality of write data signals.

8. The flash memory device according to claim 7, wherein said program voltage generator comprises:
   a plurality of program voltage generation circuits respectively connected to said source line, and
   a controller that controls the number of program voltage generation circuits made to operate, among said plurality of program voltage generation circuits, by said plurality of write data signals.

9. The flash memory device according to claim 7, wherein said program voltage generator comprises a charge pump circuit, said charge pump circuit including a booster capacitor and a rectifier element, an operation of each said charge pump circuit being controlled by said plurality of write data signals, wherein an output signal of said charge pump circuit is connected to said source line.

10. The flash memory device according to claim 8, wherein each of said plurality of program voltage generation circuits comprises a charge pump circuit including a booster capacitor and a rectifier element, an operation of said charge pump circuit being controlled by said controller.

11. A nonvolatile semiconductor memory device comprising:
- a plurality of bit lines;
- a plurality of word lines wired in a direction intersecting said plurality of bit lines;
- a source line corresponding to the plurality of word lines;
- a memory cell array including a plurality of nonvolatile memory cells arranged to correspond with respective intersection points of said plurality of bit lines and said plurality of word lines, and respectively connected to said source line and to corresponding bit lines and word lines;
- a program voltage generator which supplies to said source line a current outputted by said program voltage generator; and
- a selection circuit that selects, among said plurality of memory cells, one or more memory cells that are programmed, to flow said current outputted by said program voltage generator,
- wherein said program voltage generator comprises:
    - a plurality of program voltage generation circuits; and
    - a controller that controls, among said plurality of program voltage generation circuits, the number of program voltage generation circuits operated at the same time based on the number of memory cells that are programmed at the same time,
- wherein performing said plurality of program voltage generation circuits flow a current to said memory cells.

12. The nonvolatile semiconductor memory device according to claim 11, wherein said controller controls, among said plurality of program voltage generation circuits, the number of said program voltage generation circuits to be operated at the same time based on judging the number of said memory cells programmed at the same time by write data signals for said memory cells.

13. The nonvolatile semiconductor memory device according to claim 12, said device being able to program multi-bit data in parallel, wherein
- said controller controls the number of said program voltage generation circuits operated at the same time, based on the number of bits of logic "1" or the number of bits of logic "0", among said multi-bit data.

14. The nonvolatile semiconductor memory device according to claim 12, wherein said program voltage generation circuits comprise a charge pump circuit.

15. The nonvolatile semiconductor memory device according to claim 14, wherein an operation of said charge pump circuit is controlled by said controller.

16. The nonvolatile semiconductor memory device according to claim 12, said device being able to program multi-bit data in parallel, wherein
- in a case where logic "1" is programmed to all of said multi-bit data, all of said plurality of program voltage generation circuits are stopped.

17. A nonvolatile semiconductor memory device comprising:
- a plurality of bit lines;
- a plurality of word lines wired in a direction intersecting said plurality of bit lines;
- a source line corresponding to the plurality of word lines;
- a memory cell array including a plurality of nonvolatile memory cells arranged to correspond with respective intersection points of said plurality of bit lines and said plurality of word lines, and respectively connected to said source line and to corresponding bit lines and word lines;
- a program voltage generator that switches current supply capability to said source line based on the number of memory cells that are programmed at the same time, among said plurality of memory cells; and
- a selection circuit that selects, among said plurality of memory cells, one or more memory cells that are programmed, to flow a current outputted by said program voltage generator,
- wherein a total current outputted by said program voltage generator is based on which of the one or more the memory cells are selected.

\* \* \* \* \*